(12) United States Patent  
MacDougall et al.

(10) Patent No.: US 8,419,212 B2
(45) Date of Patent: Apr. 16, 2013

(54) CIRCUIT BOARD ASSEMBLY WITH LIGHT EMITTING ELEMENT

(75) Inventors: Alan Robert MacDougall, Beaverton, OR (US); Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 714 days.

(21) Appl. No.: 12/181,976

(22) Filed: Jul. 29, 2008

(65) Prior Publication Data

US 2010/0027264 A1 Feb. 4, 2010

(51) Int. Cl.
*B60Q 1/26* (2006.01)

(52) U.S. Cl.
USPC ............................. 362/227; 439/489; 439/490

(58) Field of Classification Search .................. 439/490, 439/76.1, 101, 489, 541.5, 607.41; 362/227, 362/236, 238, 249.01, 249.02, 249.06, 249.11, 362/646, 800; 174/382
See application file for complete search history.

(56) References Cited

U.S. PATENT DOCUMENTS

| | | | | | |
|---|---|---|---|---|---|
| 3,732,529 | A | * | 5/1973 | Weisenburger | 439/525 |
| 5,387,901 | A | * | 2/1995 | Hardt | 340/815.42 |
| 5,700,157 | A | * | 12/1997 | Chung | 439/490 |
| 5,704,802 | A | * | 1/1998 | Loudermilk | 439/490 |
| 5,876,240 | A | * | 3/1999 | Derstine et al. | 439/490 |
| 6,319,062 | B1 | * | 11/2001 | Ma et al. | 439/607.38 |
| 6,780,054 | B2 | * | 8/2004 | Yip et al. | 439/607.27 |
| 7,108,396 | B2 | * | 9/2006 | Swaris et al. | 362/249.06 |
| 7,284,882 | B2 | | 10/2007 | Burkholder | |
| 7,517,254 | B2 | * | 4/2009 | Zhang et al. | 439/668 |
| 7,651,364 | B2 | * | 1/2010 | Costello | 439/489 |
| 7,795,543 | B2 | * | 9/2010 | Krohn et al. | 174/382 |

* cited by examiner

*Primary Examiner* — Hargobind S Sawhney

(57) ABSTRACT

A circuit board assembly includes a circuit board including an electrical conductor, and a light emitting element assembly. The light emitting element assembly includes a carrier mounted on the circuit board, a light emitting element mounted on the carrier, and an electrical contact held by the carrier in electrical connection with the light emitting element and the electrical conductor.

23 Claims, 15 Drawing Sheets

CIRCUIT BOARD ASSEMBLY WITH LIGHT EMITTING ELEMENT

BACKGROUND OF THE INVENTION

The subject matter described and/or illustrated herein relates generally to circuit board assemblies, and, more particularly, to circuit board assemblies that include light emitting elements.

Transceiver modules are used for making bi-directional connections to communication devices such as modems, network interfaces, and other electrical components or electrical systems such as computer systems and the like. The Small Form-Factor Pluggable (SFP) standard, which supports both fiber optic and copper based transceivers, includes specifications for transceivers that are reduced in size to achieve a higher port density. Typically, a transceiver module is inserted into a complementary metal cage assembly that is mounted on a circuit board. In order to increase transceiver density on the circuit board, a stacked cage and connector system is sometimes used wherein the transceiver modules are arranged in rows and columns with each transceiver module plugged into a socket or receptacle in the cage.

In some applications, a status indicator is, such as a light emitting diode (LED), is used to display the status of the transceiver module. The status indicators are typically mounted on the transceiver modules, on the metal cage, or on the circuit board adjacent the metal cage, and may be visible through an opening within the metal cage or a panel framing the metal cage. However, because of the size and density of the transceiver modules, it remains a challenge to accommodate the status indicators on the transceiver modules. Similarly, the size and density of the transceiver modules and associated components on the circuit board make it difficult to locate the status indicators on the metal cage or on the circuit board adjacent the metal cage.

There is a need for an electrical connector assembly that includes a circuit board assembly having available space for a plurality of status indicators.

BRIEF DESCRIPTION OF THE INVENTION

In one embodiment, a circuit board assembly is provided that includes a circuit board including an electrical conductor, and a light emitting element assembly. The light emitting element assembly includes a carrier mounted on the circuit board, a light emitting element mounted on the carrier, and an electrical contact held by the carrier in electrical connection with the light emitting element and the electrical conductor.

In another embodiment, a circuit board assembly is provided that includes a circuit board having opposite first and second surfaces each extending between at least one edge surface that intersects the first and second surfaces. The circuit board assembly also includes a light emitting element assembly including a carrier mounted on the circuit board such that at least a portion of the carrier extends along at least one of the first and second surfaces. The light emitting element assembly also includes a light emitting element mounted on the carrier such that at least a portion of the light emitting element extends along the edge surface within a thickness of the circuit board defined between the first and second surfaces.

In another embodiment, an electrical connector assembly is provided that includes a circuit board having opposite first and second surfaces each extending between at least one edge surface that intersects the first and second surfaces. The circuit board assembly also includes a cage member having at least one compartment for receiving a pluggable electrical component therein. The cage member is mounted on the first surface of the circuit board. The circuit board assembly also includes a light emitting element assembly having a carrier mounted on the circuit board such that at least a portion of the carrier extends along the second surface of the circuit board, and a light emitting element mounted on the carrier.

DETAILED DESCRIPTION OF THE INVENTION

Figure 1:
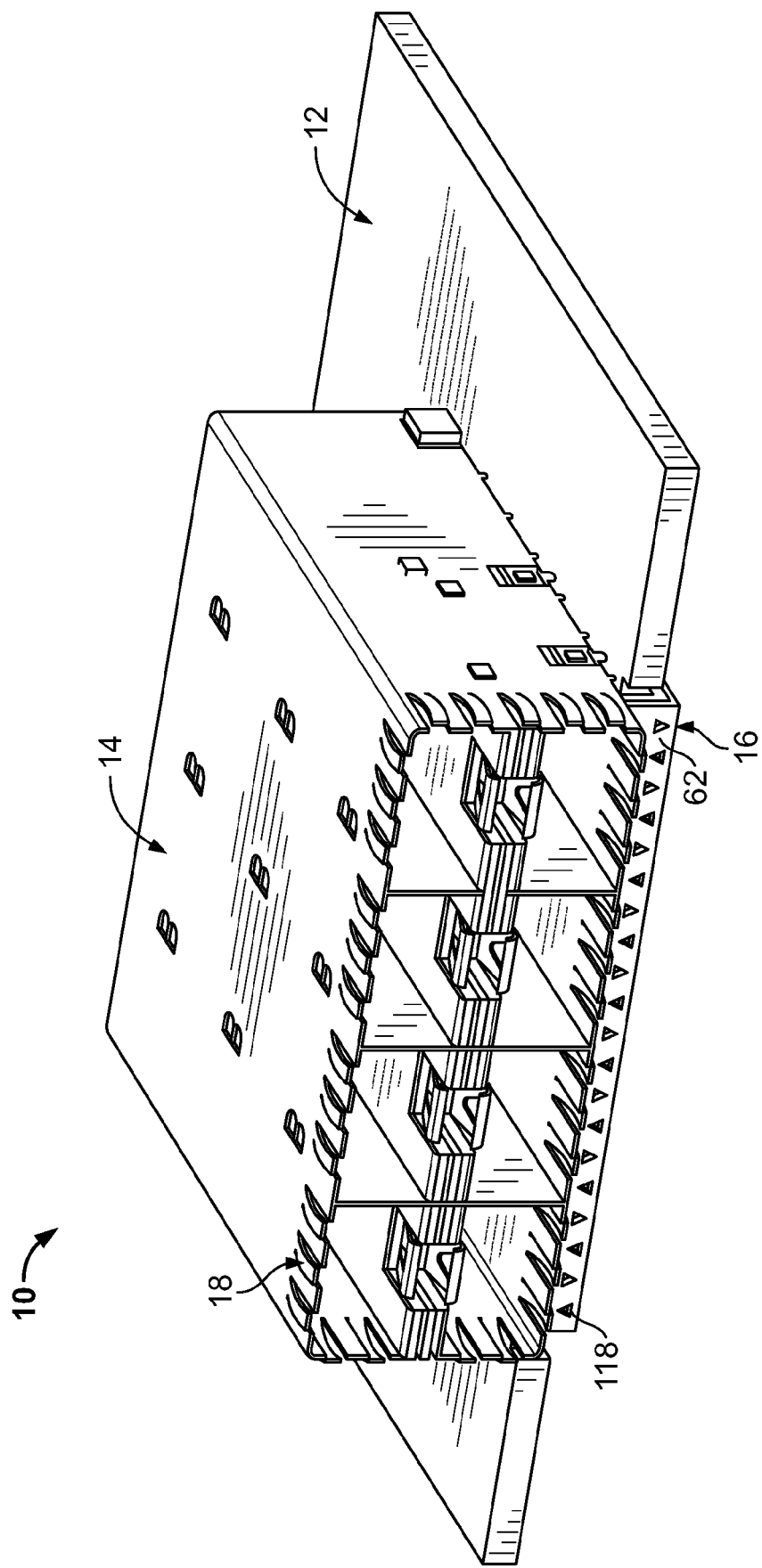
FIG. 1 is a top perspective view of an exemplary embodiment of an electrical connector assembly.
Figure 2:
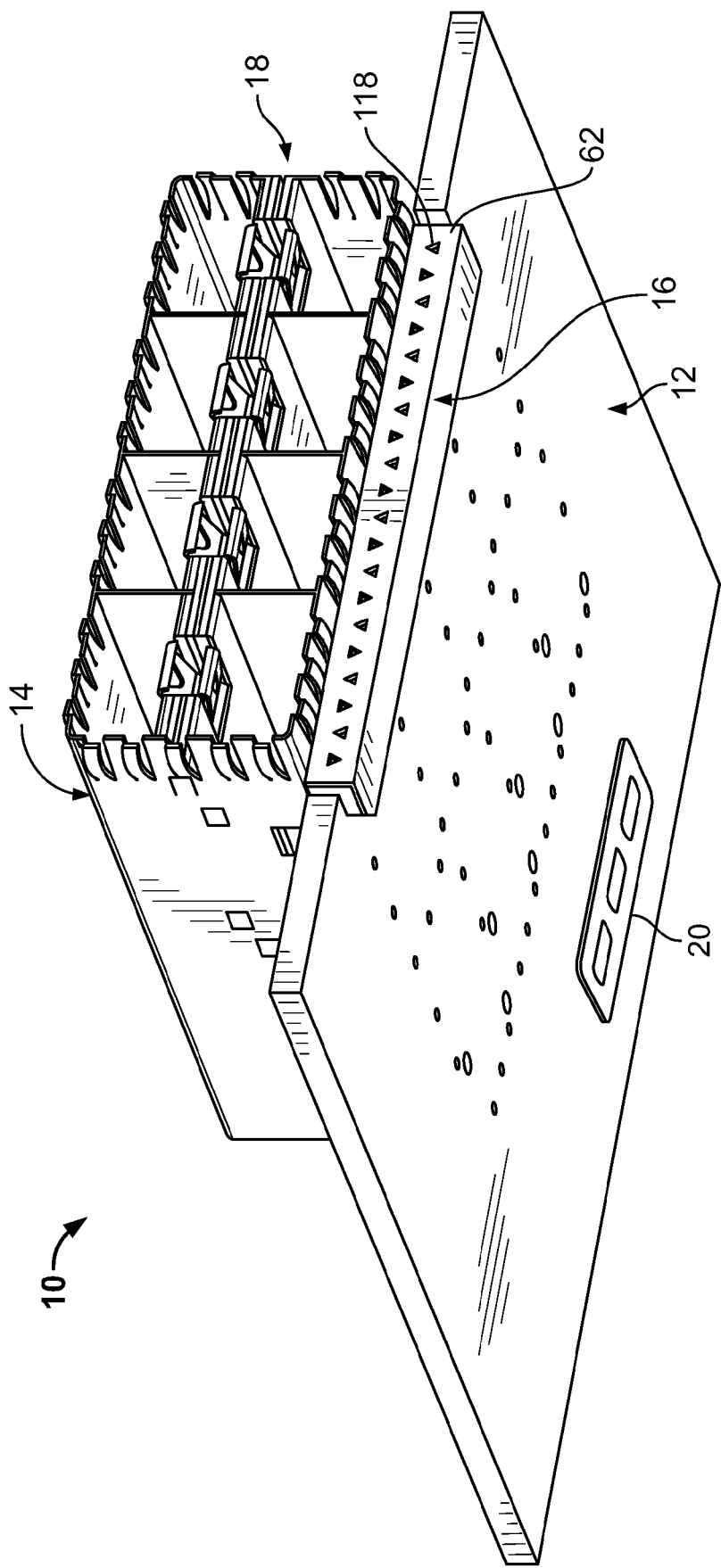
FIG. 2 is a bottom perspective view of the electrical connector assembly shown in FIG. 1.

FIG. 1 is a top perspective view of the electrical connector assembly 10. FIG. 2 is a bottom perspective view of the electrical connector assembly 10. The electrical connector assembly 10 includes a circuit board 12, a shielded cage member 14 mounted on the circuit board 12, and a light emitting element assembly 16 mounted on the circuit board 12. An end portion 18 of the cage member 14 is optionally configured to be mounted, or received, within an opening (not shown) of a panel (not shown). The circuit board 12 optionally includes an interface connector 20 (FIG. 2) for electrically connecting the circuit board 12 to another electrical device, such as, but not limited to, a linecard (not shown), a backplane (not shown), and/or the like of a host system (not shown).

Figure 3:
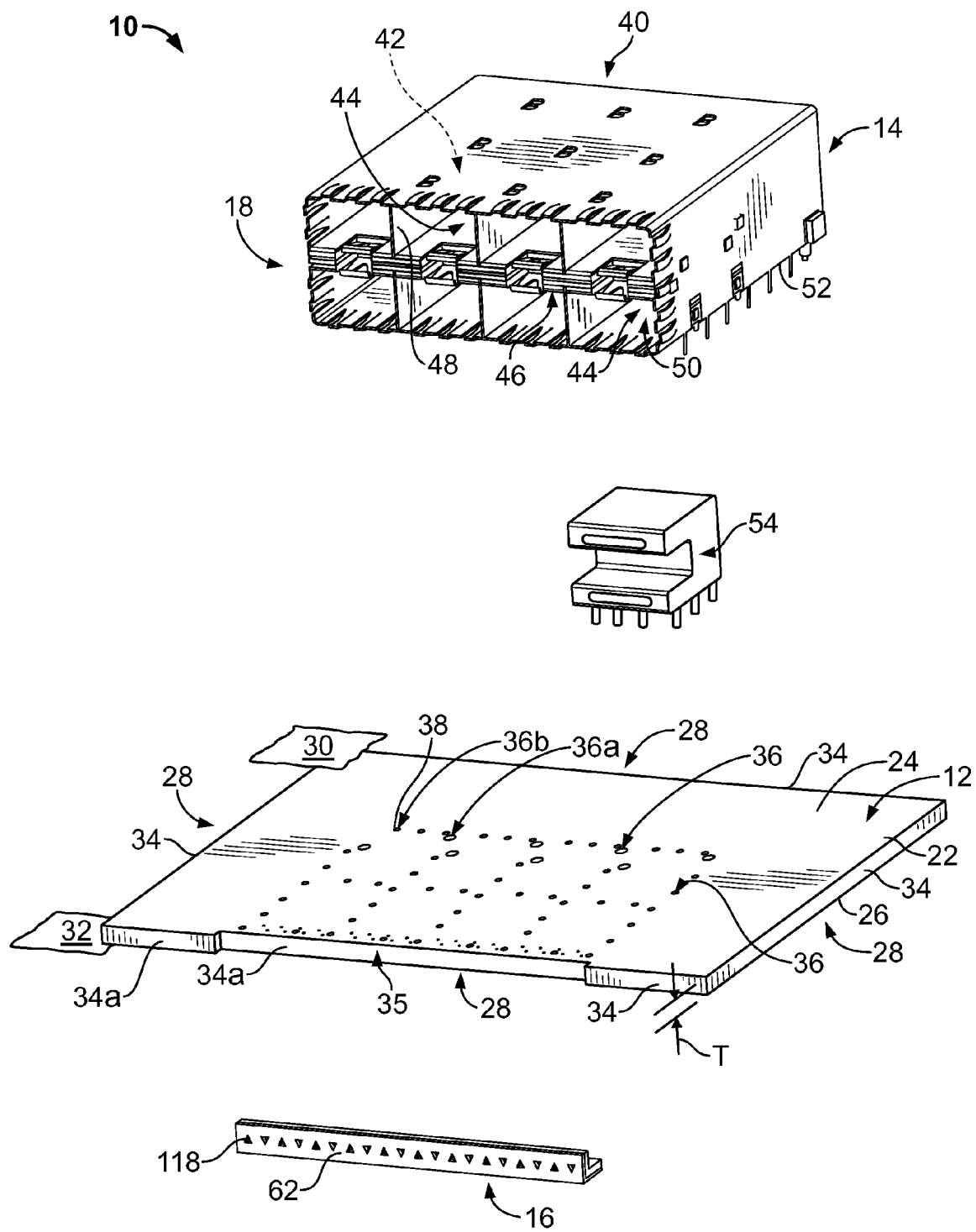
FIG. 3 is an exploded perspective view of the electrical connector assembly shown in FIGS. 1 and 2.

FIG. 3 is an exploded perspective view of the electrical connector assembly 10. The circuit board 12 includes a dielectric substrate 22 having a pair of opposite surfaces 24 and 26 that each extend between a plurality of edge portions 28. In the illustrated embodiment, the surfaces 24 and 26 are each approximately planar and extend approximately parallel to each other. Each of the surfaces 24 and 26 lies within a respective plane 30 and 32. A distance between the planes 30 and 32 defines a thickness T of the circuit board 12. Each edge portion 28 includes an edge surface 34 that intersects the surfaces 24 and 26. In the illustrated embodiment, the edge surfaces 34 each extend approximately perpendicular to each of the surfaces 24 and 26. An edge surface 34a of the circuit board 12 optionally includes a recessed portion 35 that extend along at least a portion of a length of the edge surface 34a. As will be described below, the light emitting element assembly 16 is optionally mounted to the circuit board 12 along the recessed portion 35 of the edge surface 34a.

The circuit board 12 includes a plurality of electrical conductors 36. For example, the surfaces 24 and 26 each optionally include electrically conductive pads 36a. The circuit board 12 may optionally include a plurality of vias 38 that are plated with an electrically conductive material 36b. The electrical conductors 36 of the circuit board 12 may optionally include one or more electrically conductive traces (not shown) on the surface 24, the surface 26, and/or on an internal layer of the circuit board 12. Although both of the surfaces 24 and 26 are shown as including the electrically conductive pads 36a and as having the vias 38 extending therethrough, in some alternative embodiments, only one of the surfaces 24 or 26 includes the electrically conductive pads 36a and/or the vias 38 extending therethrough. The electrical conductors 36, including any electrically conductive traces, may each be carry electrical signals, electrical grounds, or electrical power.

The cage member 14 includes the end portion 18, an opposite end portion 40, and an internal chamber 42 that is subdivided into a plurality of internal compartments 44, which are arranged in a plurality of rows and columns. Specifically, in the illustrated embodiment, the cage member 14 includes a center separator member 46 that divides the internal compartments 44 into two rows, and three divider walls 48 that divide the internal compartments 44 into four columns. Each internal compartment 44 receives a pluggable electrical component (not shown) therein through a corresponding opening, or port, 50 at the cage member end portion 18 that communicates with the corresponding compartment 44. For each column of the internal compartments 44, the cage member 14 also includes an opening (not shown) extending through a lower wall 52 of the cage member 14, and an opening (not shown) extending through the center separator member 46. The openings extending through the lower wall 52 and the center separator member are adjacent the end portion 40 of the cage member 14 for receiving a corresponding electrical connector 54 (only one electrical connector 54 is shown) within the internal chamber 42 of the cage member 14. The openings within the lower wall 52 of the cage member 14 enable electrical connection between the electrical connectors 54 and the circuit board 12. When the pluggable electrical components are received within the corresponding internal compartment 44, the pluggable electrical component is engaged with and electrically connected to the corresponding electrical connector 54. Each of the electrical connector 54 is electrically connected to corresponding electrical conductors 36 of the circuit board 12 to provide an electrical connection between the corresponding pluggable electrical component and the circuit board 12.

Figure 4:
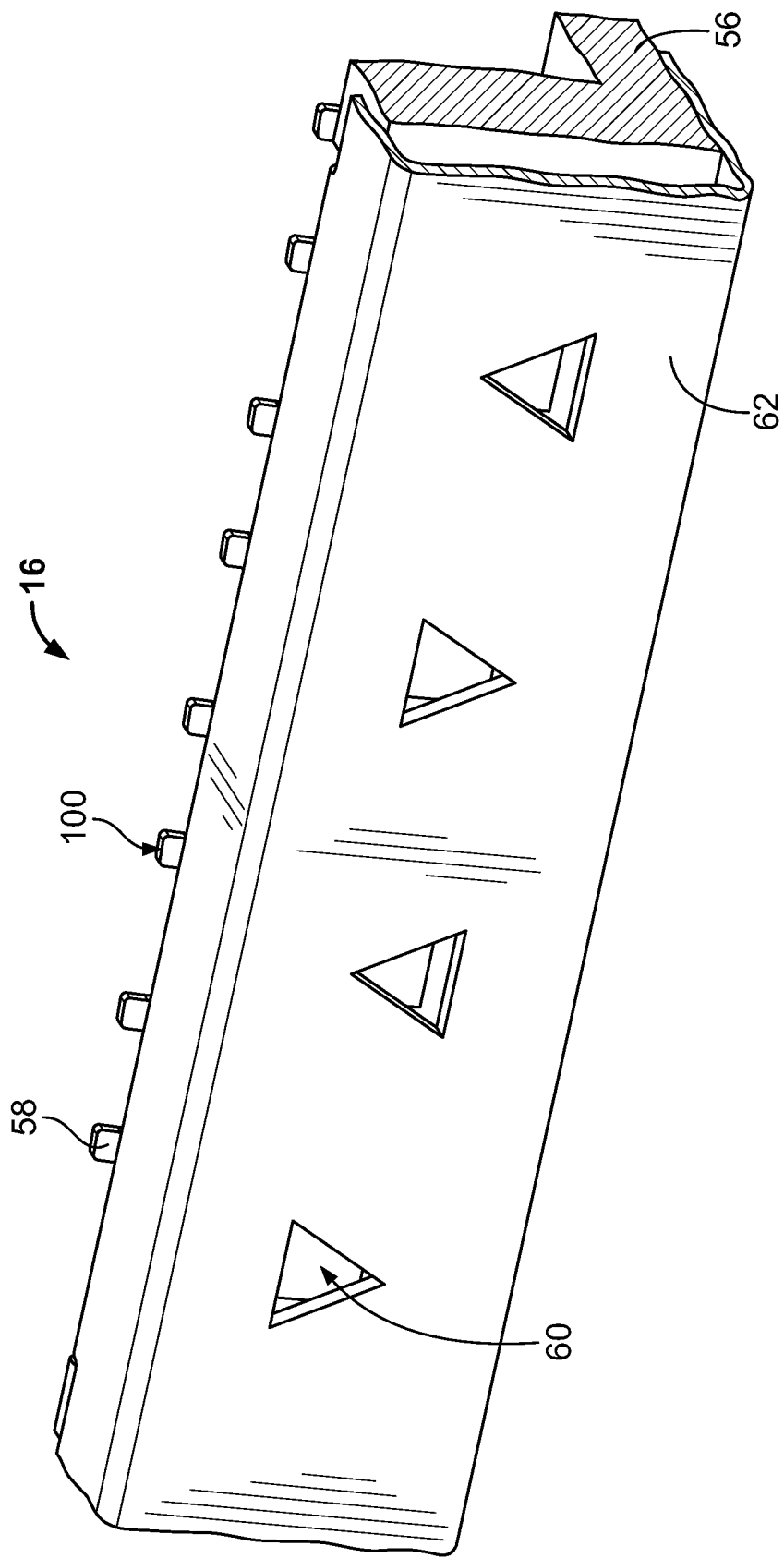
FIG. 4 is a front perspective view of a portion of an exemplary embodiment of a light emitting element assembly of the electrical connector assembly shown in FIGS. 1-3.
Figure 5:
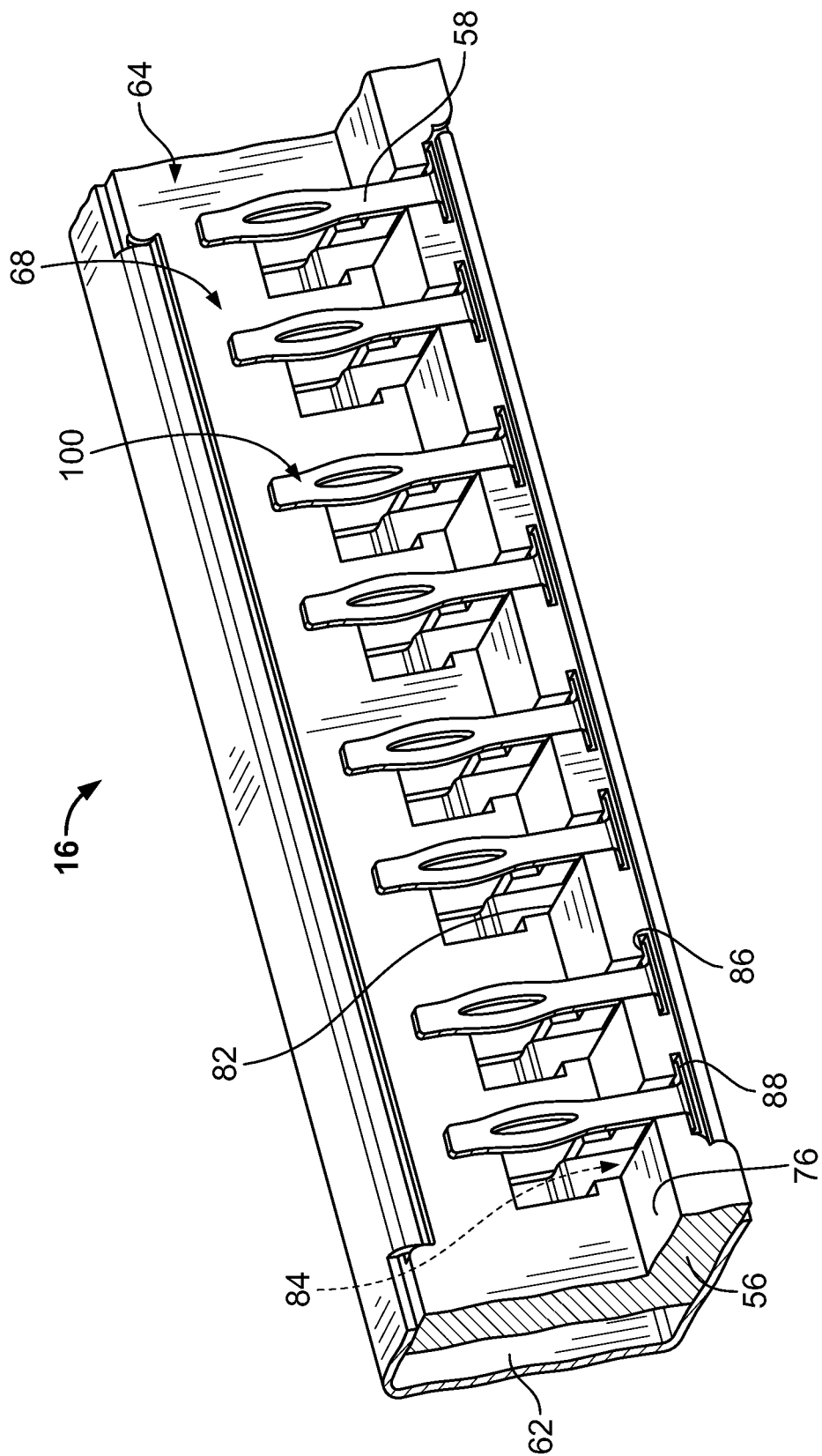
FIG. 5 is a rear perspective view of the portion of the light emitting element assembly shown in FIG. 4.

FIGS. 4 and 5 are perspective views of a portion of an exemplary embodiment of the light emitting element assembly 16. The light emitting element assembly 16 includes a dielectric carrier 56, a plurality of electrical contacts 58 held by the carrier 56, a plurality of light emitting elements 60 (FIG. 4), and an optional cover 62. The light emitting elements 60 are mounted on the carrier 56 and the cover 62 covers a portion of each of the light emitting elements 60. As will be described below, the carrier 56 is configured to be mounted on the circuit board 12 (FIGS. 1-3 and 12) to thereby mount the light emitting elements 60 on the circuit board 12. When the carrier 56 is mounted on the circuit board 12, the electrical contacts 58 electrically connect corresponding light emitting elements 60 to corresponding electrical conductors 36 (FIGS. 3 and 12) of the circuit board 12.

Figure 6:
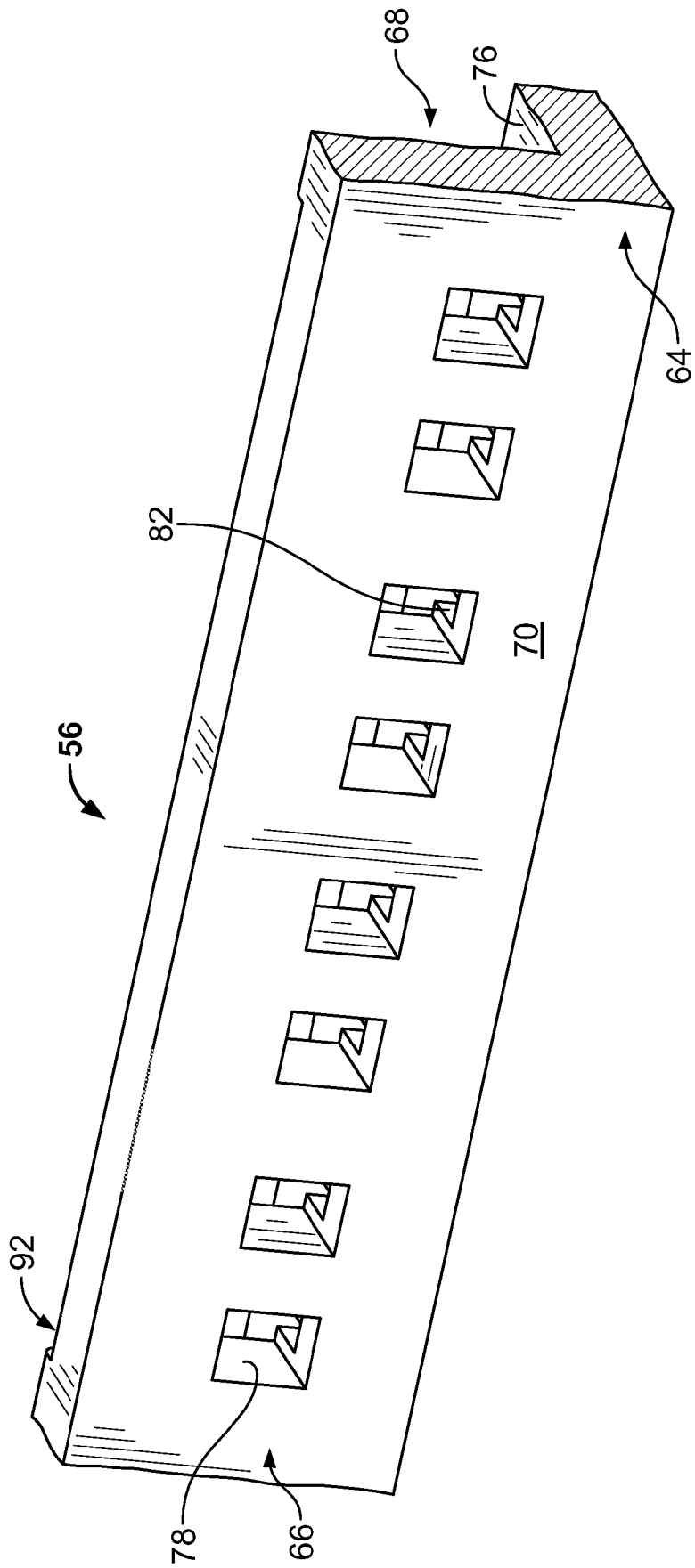
FIG. 6 is a front perspective view of an exemplary embodiment of a carrier of the light emitting element assembly shown in FIGS. 4 and 5.
Figure 7:
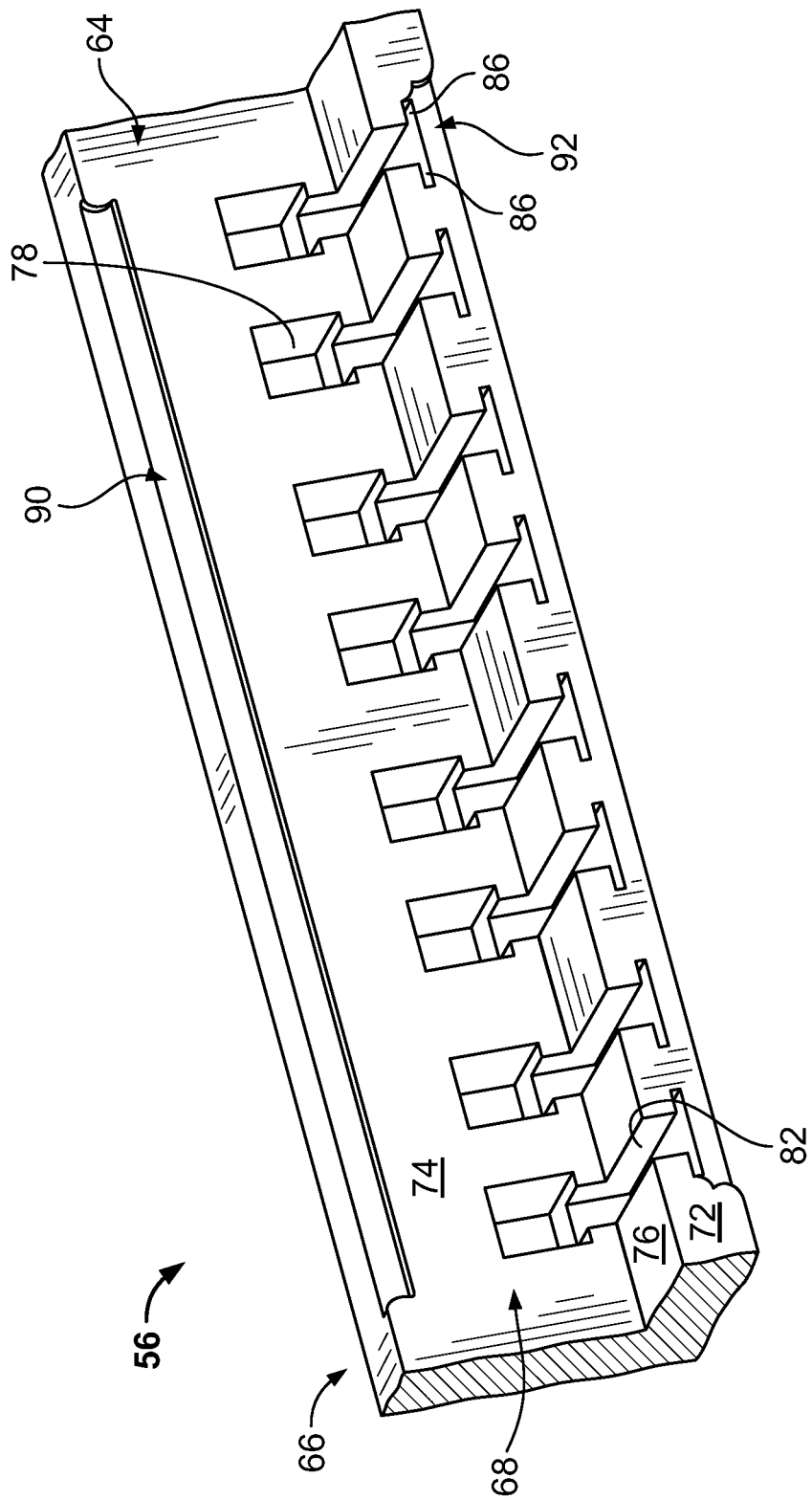
FIG. 7 is a rear perspective view of the carrier shown in FIG. 6.

FIGS. 6 and 7 are perspective views of an exemplary embodiment of a portion of the carrier 56. The carrier 56 includes a dielectric body 64 having a pair of opposite side portions 66 and 68. The carrier body 64 may be fabricated from any suitable dielectric material(s) that enable the carrier 56 to function as described and/or illustrated herein. The side portion 66 includes a face 70 (FIG. 6) along which the light emitting elements 60 (FIGS. 4, 10, and 12) are mounted, as will be described below. The side portion 68 includes a face 72 (FIG. 7), a face 74 (FIG. 7) that is opposite the face 70, and a face 76 that is configured to be mounted along the surface 26 (FIG. 3) of the circuit board 12 (FIGS. 1-3 and 12), as will be described below. The carrier body 64 includes a plurality of openings 78 that extend through the side portion 66, the body 64, and the side portion 68. Specifically, the openings 78 extend through both faces 70 and 74. As will be described below, each opening 78 holds a contact portion 80 (FIGS. 8-10) of a corresponding one of the electrical contacts 58 (FIGS. 4, 5, and 8-10) therein. Although eight openings 78 are shown FIGS. 5, 6, 7, 9, and 10 within the portion of the carrier 56 shown in FIGS. 4-7, 9, 10, and 12, the carrier 56 may include any number of openings 78 for holding any number of contact portions 80.

The carrier body 64 includes a plurality of slots 82 that extend within the side portion 68 through portions of the faces 72, 74, and 76. The slots 82 are each configured to hold an intermediate portion 84 (FIGS. 5 and 8) of a corresponding one of the electrical contacts 58 therein, as will be described below. Although eight slots 82 are shown FIGS. 5 and 7 within the portion of the carrier 56 shown in FIGS. 4-7, 9, 10, and 12, the carrier 56 may include any number of slots 82 for holding any number of electrical contacts 58. For each slot 82, the carrier body 64 optionally includes a pair of opposite channels 86 (FIG. 7) that extend within the carrier body 64 and communicate with the corresponding slot 82. As will be described below, each channel 86 receives a corresponding extension 88 (FIGS. 5 and 8) of the corresponding electrical contact 58 therein to facilitate holding the electrical contact 58 within the slot 82 using an interference-fit connection. In addition or alternative to the channels 86, the carrier body 64 may include any other suitable structure, means, and/or the like that enables the carrier body 64 to hold the electrical contacts 58 using any suitable method, type of connection, and/or the like. Although the carrier body 64 is shown as having a pair of channels 86 for each slot 82, the carrier body 64 may include any number of channels 86 for each slot 82 and any number of channels 86 overall.

The faces 72 and 74 of the side portion 68 of the carrier body 64 each include a respective recessed portion 90 (FIG.

7) and 92. As will be described below, the recessed portions 90 and 92 each communicate with a respective flange 94 and 96 (FIG. 11) of the cover 62 (FIGS. 4, 5, 11, and 12) to facilitate mounting the cover 62 on the carrier 56 using a snap-fit connection. In addition or alternative to the recessed portions 90 and 92, the carrier body 64 may include any other suitable structure, means, and/or the like that enables the cover 62 to be mounted on the carrier 56 using any suitable method, type of connection, and/or the like.

Figure 8:
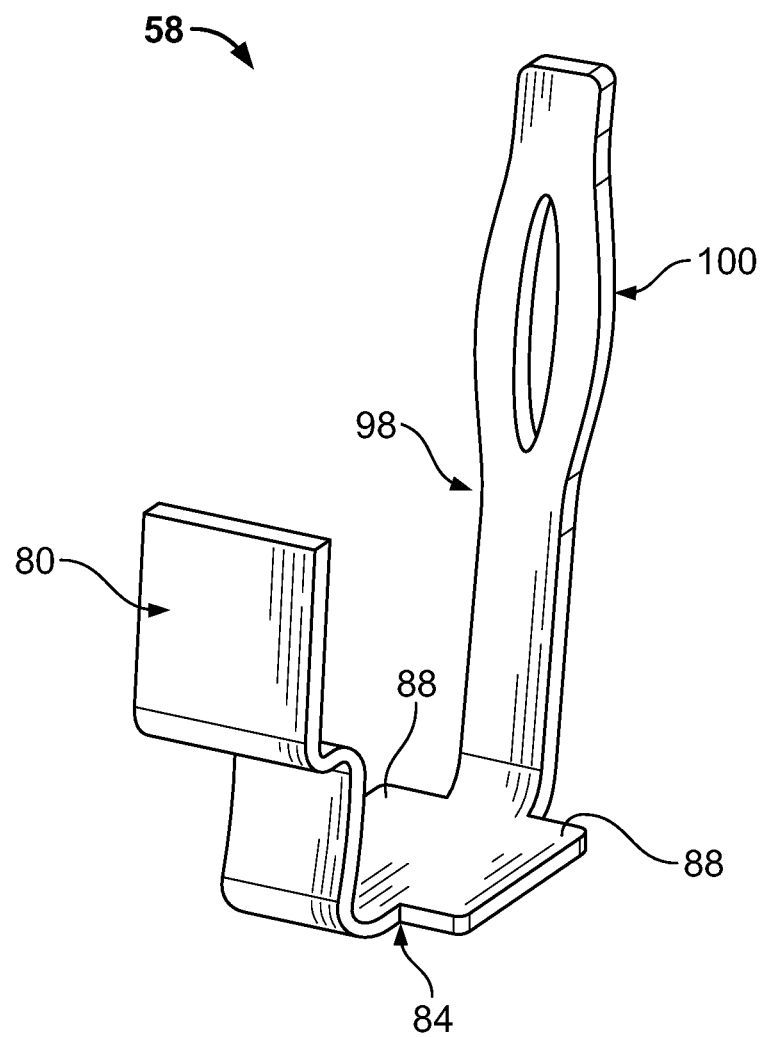
FIG. 8 is a perspective view of an exemplary embodiment of an electrical contact of the light emitting element assembly shown in FIGS. 4 and 5.

FIG. 8 is a perspective view of an exemplary embodiment of the electrical contact 58. Each electrical contact 58 includes an electrically conductive body 98 having the contact portion 80, a contact portion 100, and the intermediate portion 84 extending between the contact portions 80 and 100. The electrical contact body 98 may be fabricated from any suitable electrically conductive material(s) that enable the electrical contact 58 to function as described and/or illustrated herein. Each electrical contact 58 may carry an electrical signal, an electrical ground, or electrical power.

Figure 10:
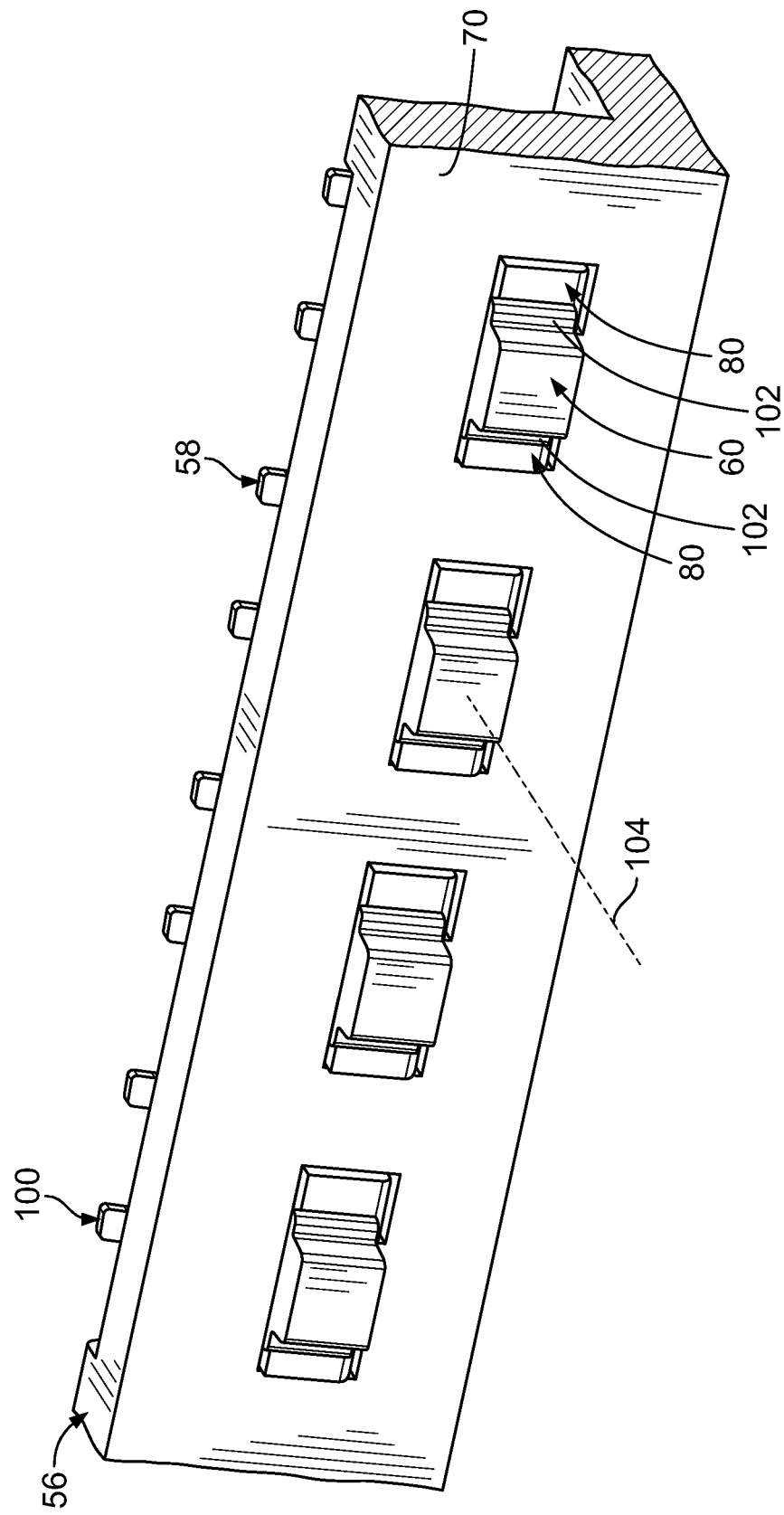
FIG. 10 is a perspective view of the carrier shown in FIGS. 6 and 7 having a plurality of light emitting elements mounted thereon.
Figure 12:
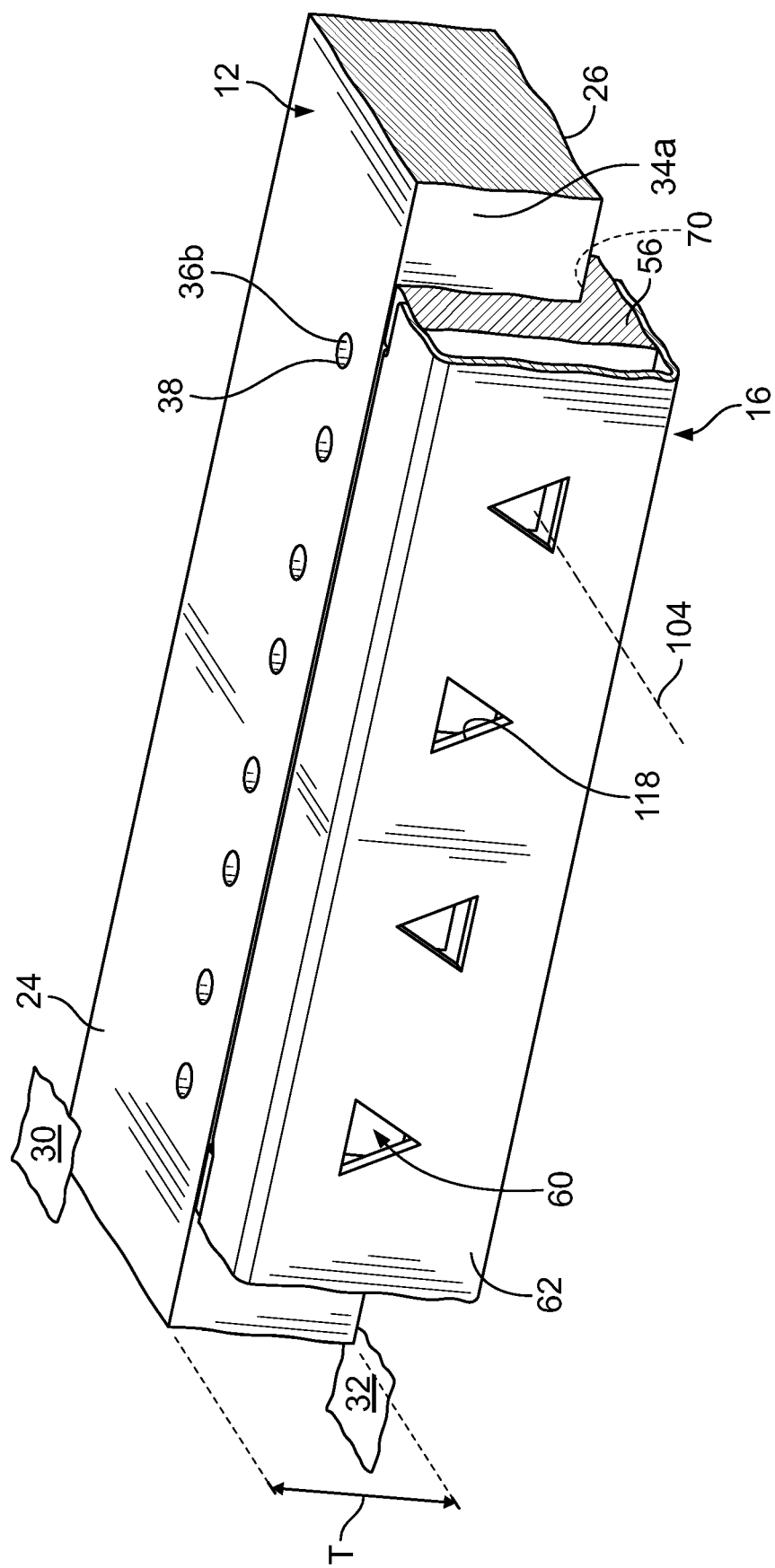
FIG. 12 is a perspective view of the light emitting element assembly shown in FIGS. 4 and 5 mounted on a circuit board of the electrical connector assembly shown in FIGS. 1-3.

As will be described below, the contact portion 80 is configured to engage a corresponding electrical contact 102 (FIG. 10) of a corresponding one of the light emitting elements 60 (FIGS. 4, 10, and 12). The contact portion 100 is configured to engage a corresponding electrical conductor 36 (FIGS. 3 and 12) of the circuit board 12 (FIGS. 1-3 and 12). Although the contact portion 100 is shown herein as a press-fit contact, the contact portion 100 may be any suitable type of electrical contact, having any suitable size, shape, and/or the like, that enables the contact portion 100 to function as described and/or illustrated herein, such as, but not limited to, the press-fit type shown herein, a surface mount type, and/or a solder tail type. Similarly, the contact portion 80 may be any suitable type of electrical contact, having any suitable size, shape, and/or the like, that enables the contact portion 80 to function as described and/or illustrated herein.

The intermediate portion 84 of the electrical contact body 98 includes the pair of extensions 88 that are configured to be received within the channels 86 (FIGS. 5 and 7) to facilitate the electrical contact 58 being held by the carrier 56 (FIGS. 4-7, 9, 10, and 12) using an interference-fit connection. In addition or alternative to the extensions 88, the electrical contact body 98 may include any other suitable structure, means, and/or the like that enables the carrier 56 to hold the electrical contact 58 using any suitable method, type of connection, and/or the like. Although the electrical contact body 98 is shown as having a pair of extensions 88, the electrical contact body 98 may include any number of extensions 88 for reception within any number of channels 86 (FIGS. 5 and 7).

Although the electrical contacts 58 are described and illustrated herein with the specific geometry shown in the Figures, the electrical contacts 58 may each have any other suitable size, shape, and/or the like that enables the electrical contacts 58 to electrically connect the light emitting elements 60 to the circuit board 12.

Referring now to FIG. 5, the electrical contacts 58 are held by the carrier 56 such that the intermediate portions 84 are received within the slots 82. Each extension 88 is received within the corresponding channel 86 with an interference-fit with a portion of the carrier body 64 that defines the channel 86 to hold the electrical contact 58 within the corresponding slot 82. When the electrical contacts 58 are received within the slots 82 as shown in FIG. 5, the contact portion 100 of each electrical contact 58 extends along the side portion 68 of the carrier body 64 and outwardly from the carrier body face 76 for engagement with the corresponding electrical conductor 36 (FIGS. 3 and 12) of the circuit board 12 (FIGS. 1-3 and 12).

Figure 9:
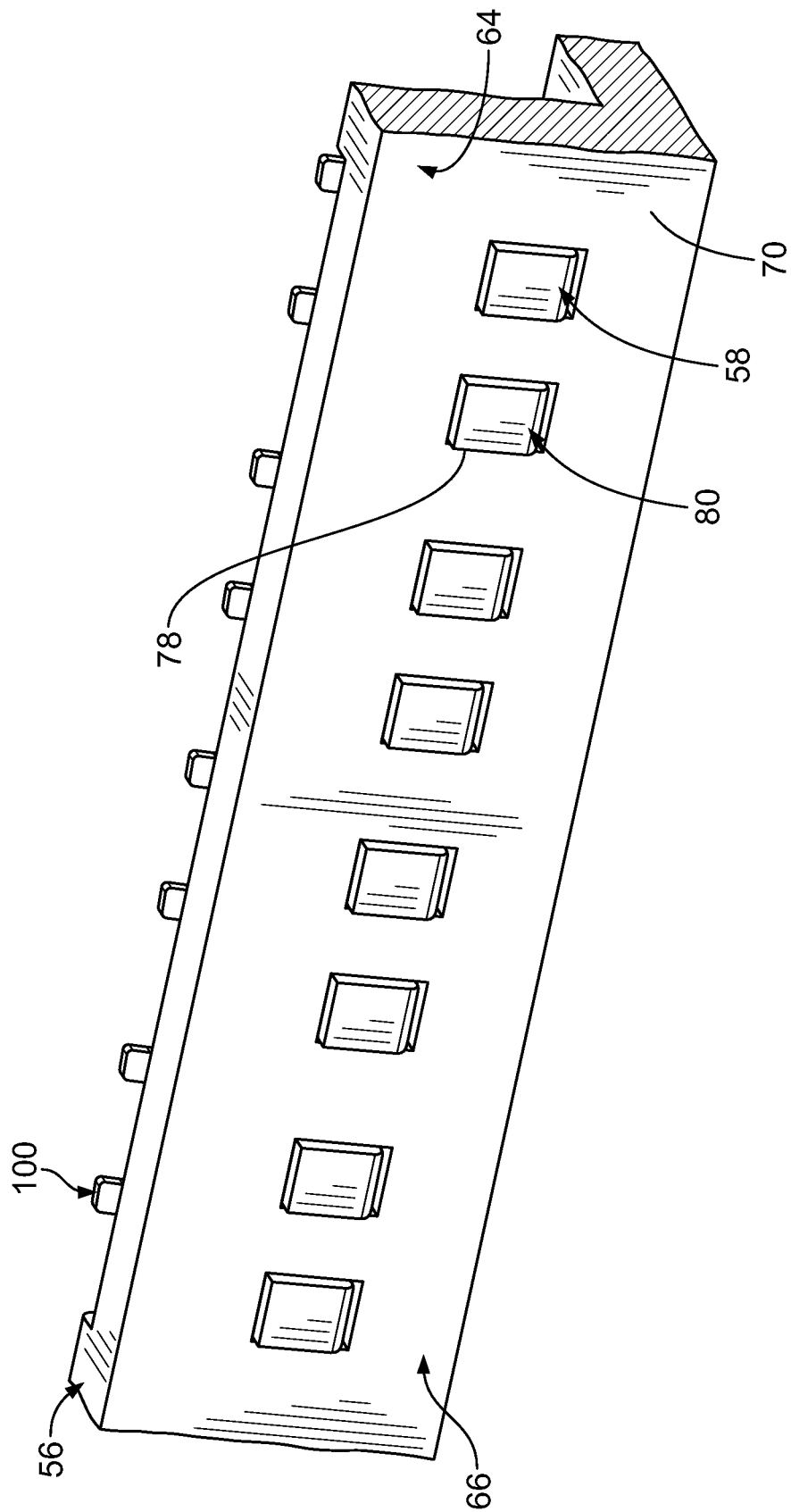
FIG. 9 is a perspective view of the carrier shown in FIGS. 6 and 7 holding a plurality of the electrical contact shown in FIG. 8.

FIG. 9 is a perspective view of a portion of the carrier 56 holding the electrical contacts 58. The contact portion 80 of each electrical contact 58 extends along the side portion 66 of the carrier body 64. Specifically, the contact portions 80 are each received within the corresponding opening 78 such that the contact portions 80 extend along the face 70 of the carrier body 64 for engagement with the corresponding electrical contact 102 (FIG. 10) of the corresponding light emitting element 60 (FIGS. 4, 10, and 12). As can be seen in FIG. 9, in the illustrated embodiment, the electrical contacts 58 are arranged in pairs for electrical connection with pairs of the electrical contacts 102 of each corresponding light emitting element 60. Although the portion of the carrier 56 shown in FIGS. 4-7, 9, 10, and 12 is shown in FIGS. 4, 5, 9, and 10 as holding eight electrical contacts 58, the carrier 56 may hold any number of electrical contacts 58 for electrical connection with any number of electrical contacts 102, any number of light emitting elements 60, and any number of electrical conductors 36 (FIGS. 3 and 12) of the circuit board 12 (FIGS. 1-3 and 12).

FIG. 10 is a perspective view of a portion of the carrier 56 having a plurality of the light emitting elements 60 mounted thereon. Specifically, the light emitting elements 60 are mounted along the face 70 of the carrier 56 such that a light emitting axis 104 of each light emitting element 60 extends outwardly from the face 70 of the carrier 56. The light emitting axis 104 extends in the general direction of light emitted from the light emitting element 60. In the illustrated embodiment, the light emitting axes 104 of the light emitting elements 60 extend approximately perpendicular to the face 70. Alternatively, one or more of the light emitting elements 60 are mounted along the face 70 such that one or more of the light emitting axes 104 extends at any non-perpendicular angle relative to the face 70.

When the light emitting elements 60 are mounted on the carrier 56 as shown in FIG. 10, each pair of electrical contacts 102 of each light emitting element 60 is engaged with, and electrically connected to, the corresponding electrical contact portion 80 of the corresponding pair of electrical contacts 58. In the illustrated embodiment, the electrical contacts 102 are soldered to the electrical contact portions 80. However, each electrical contact 102 may be electrically connected to the corresponding electrical contact portion 80 using any suitable structure, means, method, connection type, and/or the like, such as, but not limited to, using an electrically conductive adhesive (such as, but not limited to, an electrically conductive epoxy), a press-fit arrangement, solder, and/or the like. In the illustrated embodiment, the soldered connection between the electrical contacts 102 and the electrical contact portions 80 holds the light emitting elements on the carrier 56. However, in addition or alternative to whatever connection is used to electrically connect the electrical contacts 102 to the electrical contact portions 80, the light emitting elements 60 may be held on the carrier 56 (whether or not the light emitting elements directly engage the face 70 of the carrier 56) using any suitable structure, means, method, connection type, and/or the like, such as, but not limited to, using an adhesive (such as, but not limited to, an epoxy and/or the like), one or more latch features (not shown) that cooperate with one or more latch features (not shown) on the carrier 56, and/or the like.

The light emitting elements 60 may each be any suitable type of light emitting device, such as, but not limited to, a light emitting diode (LED), an incandescent bulb, an electroluminescent element, and/or the like. Although four light emitting elements 60 are shown in FIGS. 4, 10, and 12 as being mounted on the portion of the carrier 56 shown in FIGS. 4-7, 9, 10, and 12, any number of light emitting elements 60 may be mounted on the carrier 56.

Figure 11:
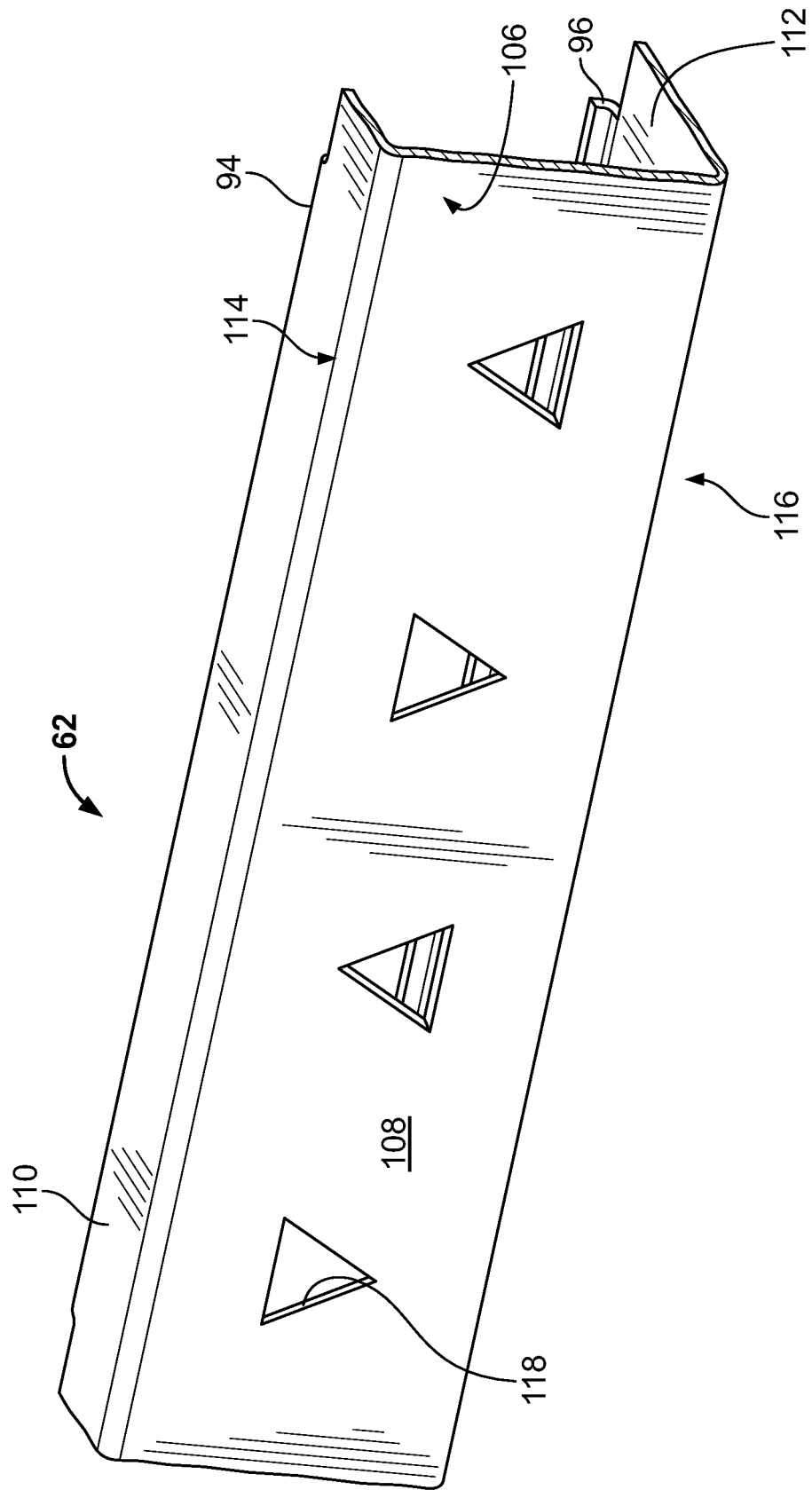
FIG. 11 is a perspective view of an exemplary embodiment of a cover of the light emitting element assembly shown in FIGS. 4 and 5.

FIG. 11 is a perspective view of an exemplary embodiment of a portion of the cover 62. The cover 62 includes a body 106 having a wall 108 and a pair of walls 110 and 112 that extend from the wall 108. Specifically, the wall 108 extends between a pair of opposite end portions 114 and 116. The wall 110 extends outwardly from the end portion 114, while the wall 112 extends outwardly from the end portion 116. Although the walls 110 and 112 extend approximately perpendicular to the wall 108 in the illustrated embodiment, the walls 110 and 112 may each extend at any other angle relative to the wall 108. The wall 108 of the cover body 106 includes a plurality of openings 118 extending therethrough. As will be described below, the openings 118 are each configured to be aligned with a corresponding one of the light emitting elements 60 (FIGS. 4, 10, and 12) when the cover 62 is mounted on the carrier 56 (FIGS. 4-7, 9, 10, and 12). In addition or alternative to the openings 118, an entirety or portions of the cover 62 may be transparent to enable light emitted from the light emitting elements 60 to be visible through the cover 62.

The cover body 106 includes the flanges 94 and 96. Specifically, the wall 110 includes the flange 94 and the wall includes the flange 96. As will be described below, the flanges 94 and 96 each communicate with the respective recessed portion 90 and 92 (FIGS. 6 and 7) of the carrier 56 to facilitate mounting the cover 62 on the carrier 56 using a snap-fit connection. In addition or alternative to the flanges 94 and 96, the cover body 106 may include any other suitable structure, means, and/or the like that enables the cover 62 to be mounted on the carrier 56 using any suitable method, type of connection, and/or the like.

Although the portion of the cover 62 shown in FIGS. 4, 5, 11, and 12 is shown as having four openings 118 and the cover 62 is shown in FIGS. 1-3 as having twenty openings 118, the cover 62 may have any number of openings for alignment with any number of light emitting elements 60. Although the openings 118 are each shown as having an approximately triangular shape, the openings 118 may each have any suitable shape that enables the openings 118 to function as described and/or illustrated herein. The cover body 106 may be fabricated from any suitable material(s) that enable the cover body 106 to function as described and/or illustrated herein. For example, the cover body 106 is optionally fabricated from a metallic material(s).

FIG. 12 is a perspective view of a portion of the light emitting element assembly 16 mounted on the circuit board 12. A combination of the light emitting element assembly 16 and the circuit board 12 may be referred to herein as a "circuit board assembly". The carrier 56 is mounted on the circuit board 12 such that the carrier body face 76 extends along the surface 26 of the circuit board 12. Each of the electrical contact portions 100 (FIGS. 4, 5, 8, 9, and 10) of the electrical contacts 58 (FIGS. 4, 5, 8, 9, and 10) is received within a corresponding via 38 of the circuit board 12 and is engaged with, and thereby electrically connected to, the electrical conductor 36b of the corresponding via 38. Each light emitting element 60 is thereby electrically connected to the circuit board 12. As described above, each electrical contact 58 may carry an electrical signal, an electrical ground, or electrical power between the corresponding light emitting element 60 and the circuit board 12. In alternative to the electrical contacts 58, any other suitable electrical connection that enables the light emitting elements 60 to be electrically connected to the circuit board 12 may be used, such as, but not limited to, using electrically conductive wires (not shown) and/or the like.

In the illustrated embodiment, when the light emitting element assembly 16 is mounted on the circuit board 12 the light emitting elements 60 extend along the edge surface 34a within the thickness T of the circuit board 12 defined between the pair of planes 30 and 32. In the illustrated embodiment, the entirety of each of the light emitting elements 60 extends within the thickness T such that each of the light emitting elements 60 does not extend past the planes 30 and 32 of the surfaces 24 and 26, respectively. However, in some alternative embodiments a portion of the one or more of the light emitting elements 60 may extend outside of the thickness T. In other alternative embodiments, the light element assembly 16 is configured such that no portion of one or more of the light emitting elements 60 extends within the thickness T of the circuit board 12. In embodiments wherein the surfaces 24 and/or 26 are not generally planar, the planes 30 and 32 may be any plane that a portion of the respective surface 24 and 26 lies within.

In the illustrated embodiment, the light emitting element assembly 16 is mounted on the circuit board 12 such that the light emitting axes 104 extend approximately parallel with the surfaces 24 and 26. Alternatively, the light emitting element assembly may be configured such that the light emitting axis 104 of one or more of the light emitting elements extends at any angle that is non-parallel with the surfaces 24 and/or 26.

Although the light emitting element assembly 16 is shown as being mounted on the circuit board 12 at the edge surfaces 34a of the circuit board 12, the light emitting element assembly may alternatively be mounted over one of the other edge surfaces 34 of the circuit board 12. Moreover, in addition or alternative to the light emitting element assembly 16 mounted on the edge surface 34a, the circuit board 12 may have other light emitting elements assemblies (not shown) mounted on one or more of the other edge surfaces 34 of the circuit board 12.

In operation, and referring now to FIGS. 1-3 and 12, the light emitting elements 60 (FIG. 12) are each aligned with a corresponding one of the openings 118 within the cover 62. Specifically, the light emitting axis 104 (FIG. 12) of each of the light emitting elements 60 is aligned with the corresponding opening 118 such that light is emitted from the light emitting 60 through the corresponding opening 118. As such, light emitted by each light emitting element 60 is visible through the corresponding opening 118. The light emitting elements 60 may provide an indication of a status of the assembly 10 such as, but not limited to, whether the corresponding pluggable electrical component is plugged into the corresponding internal compartment 44 (FIGS. 1-3), and/or whether the corresponding electrical connector 54 (FIG. 3) and/or the corresponding pluggable electrical component is operational and/or is sending or receiving data. The light emitting elements 60 may alternatively indicate other statuses, operations, failures, and/or the like.

Figure 13:
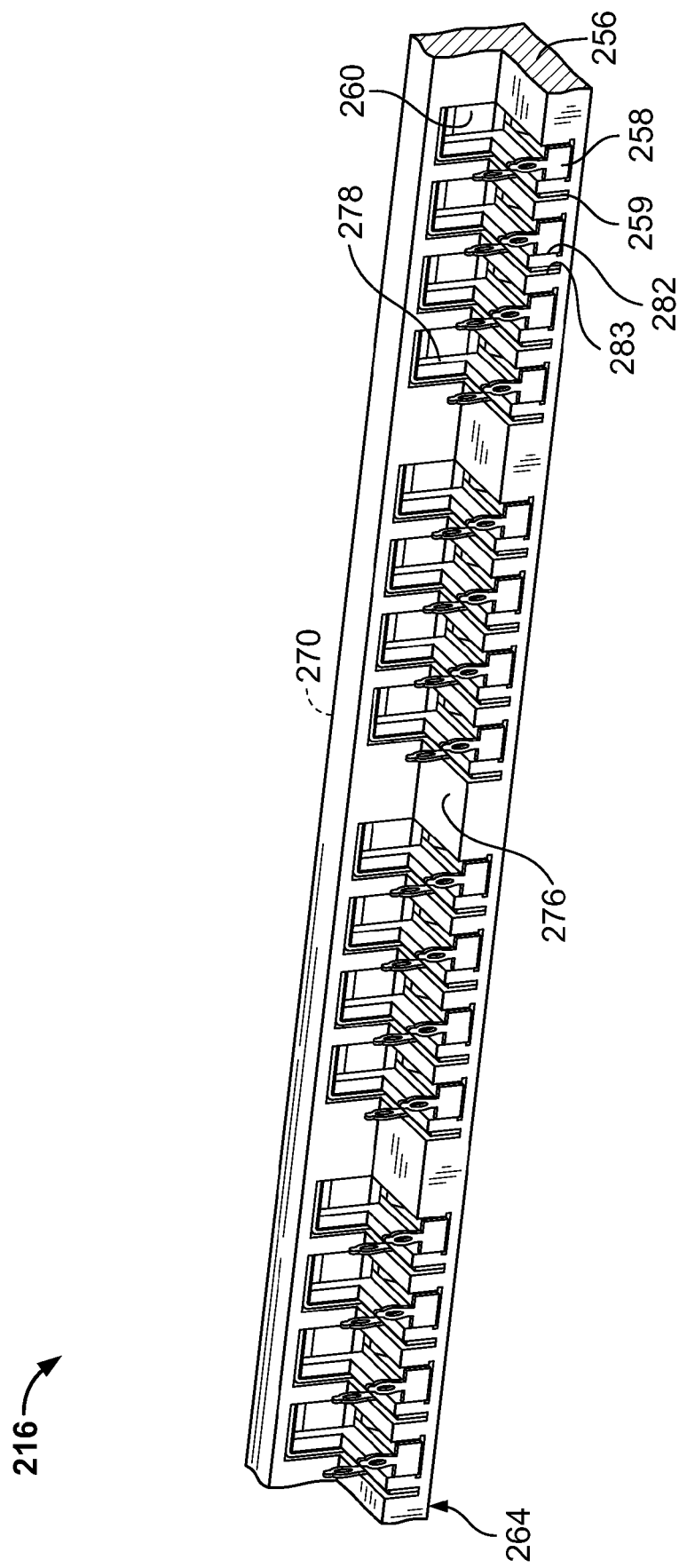
FIG. 13 is a perspective view of an exemplary alternative embodiment of a light emitting element assembly.

FIG. 13 is a perspective view of an exemplary alternative embodiment of a light emitting element assembly 216. The light emitting element assembly 216 includes a dielectric carrier 256, a plurality of electrical contacts 258 and 259 held by the carrier 256, and a plurality of light emitting elements 260 held by the carrier 256. The carrier 256 includes a dielectric body 264 having a face 270, a face 276, a plurality of recesses 278, a plurality of slots 282, and a plurality of slots 283. The carrier body 264 may be fabricated from any suitable dielectric material(s) that enable the carrier 256 to function as described and/or illustrated herein. In the illustrated embodiment, at least a portion of the carrier body 264 is transparent to enable light emitted from the light emitting elements 260 to be visible through such portion(s) of the carrier body 264.

Figure 14:
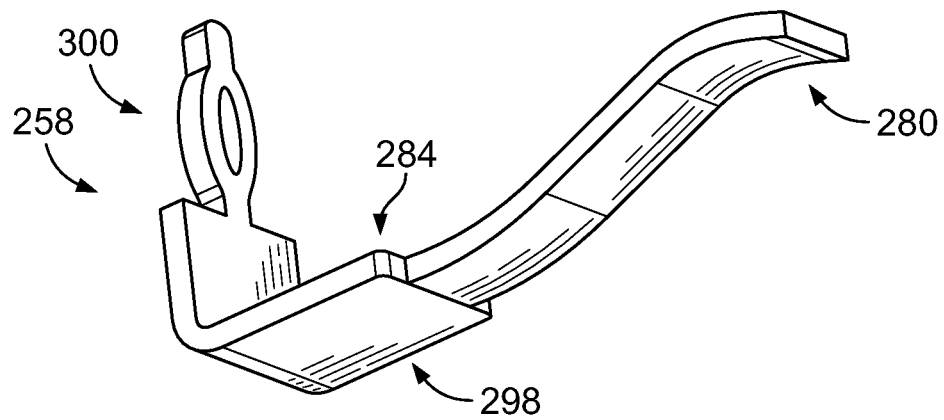
FIG. 14 is a perspective view of an exemplary embodiment of an electrical contact for use with the light emitting element assembly shown in FIG. 13.

FIG. 14 is a perspective view of an exemplary embodiment of the electrical contact 258. Each electrical contact 258 includes an electrically conductive body 298 having a contact portion 280, a contact portion 300, and an intermediate portion 284 extending between the contact portions 280 and 300. The electrical contact body 298 may be fabricated from any suitable electrically conductive material(s) that enable the electrical contact 258 to function as described and/or illustrated herein. Each electrical contact 258 may carry an electrical signal, an electrical ground, or electrical power.

Although the contact portion 300 is shown herein as a press-fit contact, the contact portion 300 may be any suitable type of electrical contact, having any suitable size, shape, and/or the like, that enables the contact portion 300 to function as described and/or illustrated herein, such as, but not limited to, the press-fit type shown herein, a surface mount type, and/or a solder tail type. Similarly, the contact portion 280 may be any suitable type of electrical contact, having any suitable size, shape, and/or the like, that enables the contact portion 280 to function as described and/or illustrated herein.

Although the electrical contacts 258 are described and illustrated herein with the specific geometry shown in the Figures, the electrical contacts 258 may each have any other suitable size, shape, and/or the like that enables the electrical contacts 258 to function as described and/or illustrated herein.

Figure 15:
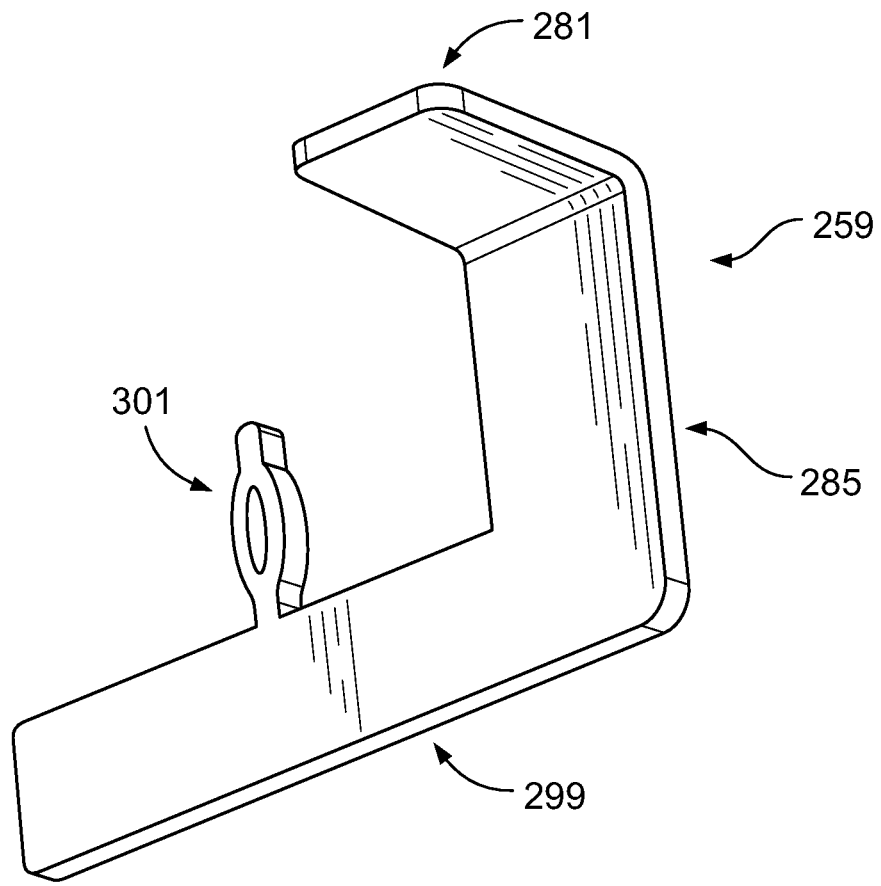
FIG. 15 is a perspective view of an exemplary embodiment of another electrical contact for use with the light emitting element assembly shown in FIG. 13.

FIG. 15 is a perspective view of an exemplary embodiment of the electrical contact 259. Each electrical contact 259 includes an electrically conductive body 299 having a contact portion 281, a contact portion 301, and an intermediate portion 285 extending between the contact portions 281 and 301. The electrical contact body 299 may be fabricated from any suitable electrically conductive material(s) that enable the electrical contact 259 to function as described and/or illustrated herein. Each electrical contact 259 may carry an electrical signal, an electrical ground, or electrical power.

Although the contact portion 301 is shown herein as a press-fit contact, the contact portion 301 may be any suitable type of electrical contact, having any suitable size, shape, and/or the like, that enables the contact portion 301 to function as described and/or illustrated herein, such as, but not limited to, the press-fit type shown herein, a surface mount type, and/or a solder tail type. Similarly, the contact portion 281 may be any suitable type of electrical contact, having any suitable size, shape, and/or the like, that enables the contact portion 281 to function as described and/or illustrated herein.

Although the electrical contacts 259 are described and illustrated herein with the specific geometry shown in the Figures, the electrical contacts 259 may each have any other suitable size, shape, and/or the like that enables the electrical contacts 259 to function as described and/or illustrated herein.

Figure 16:
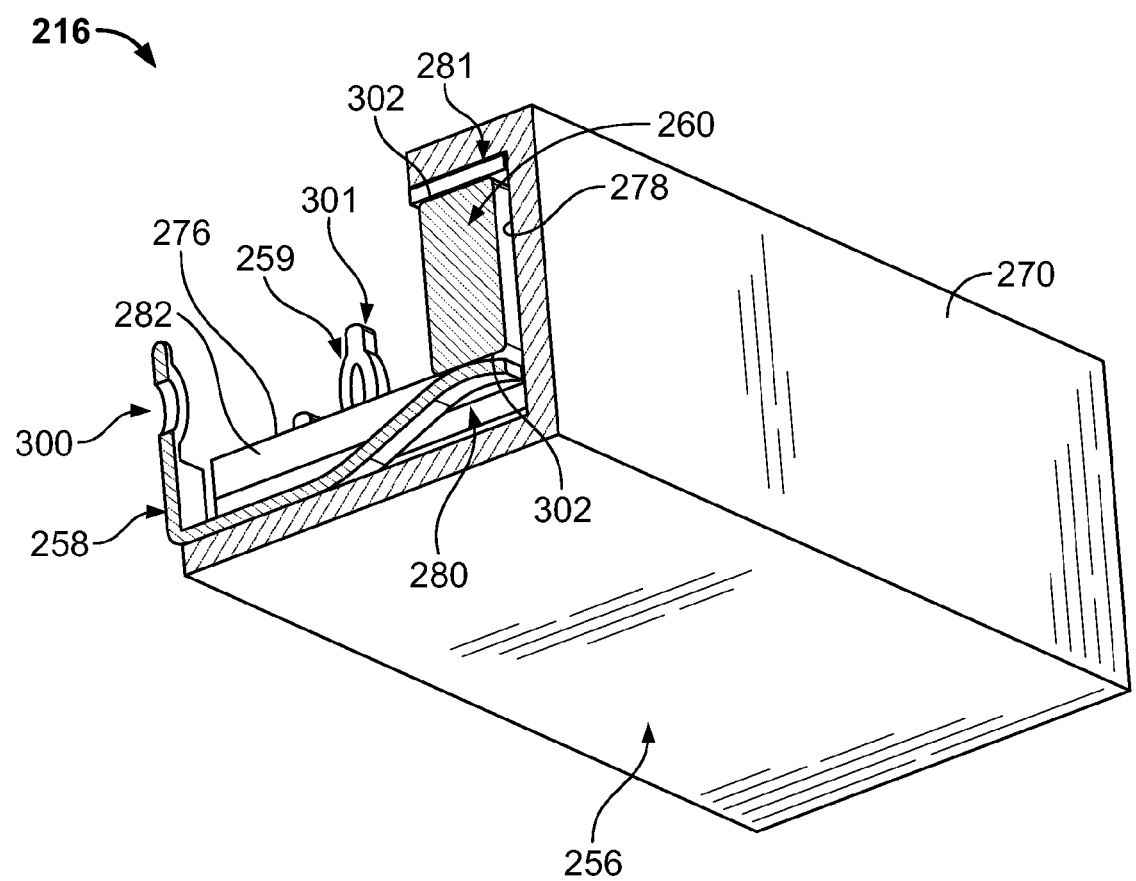
FIG. 16 is a perspective view illustrating a cross section of the light emitting element assembly shown in FIG. 13.

FIG. 16 is a perspective view illustrating a cross section of the light emitting element assembly 216. The light emitting elements 260 are each received within a corresponding recess 278 of the carrier 256. Each electrical contact 258 is received within a corresponding slot 282 such that the electrical contact portion 300 extends outwardly from and along the face 276 of the carrier 256 for electrical connection with a corresponding electrical conductor 36b (FIGS. 3 and 12) of the circuit board 12 (FIGS. 1-3 and 12). The electrical contact portion 280 extends within the corresponding recess 278 and is engaged with, and thereby electrically connected to, a corresponding electrical contact 302 of the light emitting element 260 held within the corresponding recess 278. Each electrical contact 259 is received within a corresponding slot 283 (FIG. 13) such that the electrical contact portion 301 extends outwardly from and along the face 276 of the carrier 256 for electrical connection with a corresponding electrical conductor 36b of the circuit board 12. The electrical contact portion 281 extends within the corresponding recess 278 and is engaged with, and thereby electrically connected to, a corresponding electrical contact 302 of the light emitting element 260 held within the corresponding recess 278.

As described above, at least one or more portions of the carrier body 264 along the face 270 and adjacent the recesses 278 are transparent to enable light emitted from the light emitting elements 260 to be visible through the face 270 of the carrier body 264. Alternatively, the carrier body 264 includes one or more openings (not shown) that extend through the face 270 adjacent the recesses 278 to enable light emitted from the light emitting elements 260 to be visible through the face 270 of the carrier body 264. The carrier 256 is configured to be mounted on the circuit board 12 to thereby mount the light emitting elements 260 on the circuit board 12. A combination of the light emitting element assembly 216 and the circuit board 12 may be referred to herein as a "circuit board assembly".

Referring now to FIG. 3, in some alternative embodiments, one or more of the edge surfaces 34 of the circuit board 12 may extend at any non-perpendicular angle relative to the surfaces 24 and/or 26. The opposite surfaces 24 and 26 of the circuit board 12 may alternatively extend at any non-parallel angle relative to each other. Moreover, the surfaces 24 and/or 26 may be non-planar in some alternative embodiments. Although shown as generally rectangular, the dielectric substrate 22 may have any suitable shape, which may define any number of edge portions 28.

Referring now to FIGS. 1-3, in the illustrated embodiment, the cage member 14 includes an approximately rectangular cross section. However, the cage member 14 may include any suitable shape that enables the cage member 14 to function as described and/or illustrated herein. Although the cage member 14 is shown as including eight internal compartments 44 arranged in two rows and four columns, the cage member 14 may include any number of internal compartments 44 (including only a single compartment 44), arranged in any number of rows and columns, for receiving any number of pluggable electrical components.

The pluggable electrical components may be any type of pluggable electrical component. In some embodiments, the pluggable electrical components are Small Form Factor Pluggable (SFP) compliant transceiver modules. It is to be understood, however, that the benefits and advantages of the embodiments described and/or illustrated herein may accrue equally to other types of electrical components, across a variety of systems and standards. Therefore, while the embodiments are described in the context of SFP modules, the embodiments are not intended to be limited thereto and the SFP modules are described for purposes of illustration rather than limitation.

Although the embodiments are described and illustrated herein for use with the electrical connector assembly 10, it is to be understood that the benefits and advantages of the embodiments described and/or illustrated herein may accrue equally to other types of electrical connectors besides the electrical connector assembly 10 and to circuit boards that are not a part of an electrical connector, across a variety of systems and standards. Therefore, while the embodiments are described and illustrated in the context of the electrical connector assembly 10, the embodiments are not intended to be limited thereto and the assembly 10 is provided for purposes of illustration rather than limitation. Rather, the embodiments described and illustrated herein may be used with any circuit board wherein it is desired to include light emitting elements, whether or not the circuit board is part of an electrical connector.

The embodiments described and illustrated herein provides an electrical connector assembly that includes a circuit board assembly having a plurality of light emitting elements. The embodiments described and illustrated herein may facilitate accommodating more light emitting elements than at least some known circuit boards.

It is to be understood that the above description is intended to be illustrative, and not restrictive. For example, the above-described embodiments (and/or components, steps, and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." When introducing elements/components/etc. described and/or illustrated herein, the articles "a", "an", "the", "said", and "at least one" are intended to mean that there are one or more of the element(s)/component(s)/etc. Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

While the subject matter described and/or illustrated herein has been described in terms of various specific embodiments, those skilled in the art will recognize that the subject matter described and/or illustrated herein can be practiced with modification within the spirit and scope of the claims.

What is claimed is:

1. A circuit board assembly comprising:
a circuit board including an electrical conductor, the circuit board having opposite first and second surfaces and an edge surface that extends between the first and second surfaces; and
a light emitting element assembly comprising:
a carrier mounted on the circuit board, the carrier comprising a body having a face and an opening extending through the face;
a light emitting element mounted along the face of the carrier such that at least a portion of the light emitting element extends along the edge surface within a thickness of the circuit board defined between the first and second surfaces, the light emitting element comprising a first electrical contact; and
a second electrical contact held by the carrier in electrical connection with the electrical conductor, the second electrical contact comprising a contact portion extending within the opening of the carrier such that the contact portion extends along the face of the carrier, the contact portion of the second electrical contact being engaged with and electrically connected to the first electrical contact of the light emitting element along the face of the carrier.

2. The circuit board assembly according to claim 1, wherein the light emitting element assembly further comprises a cover covering at least a portion of the face of the carrier.

3. The circuit board assembly according to claim 1, wherein the light emitting element comprises a light emitting axis that extends within the thickness of the circuit board.

4. The circuit board assembly according to claim 1, wherein the circuit board comprises a via and the second electrical contact includes another contact portion received within the via.

5. The circuit board assembly according claim 1, wherein the light emitting element is mounted on the carrier such that an entirety of the light emitting element extends within the thickness of the circuit board.

6. The circuit board assembly according to claim 1, wherein the carrier comprises a leg that extends along the edge surface within the thickness of the circuit board, the leg comprising the face, the light emitting element being mounted on the leg of the carrier.

7. The circuit board assembly according to claim 1, wherein the light emitting element comprises a light emitting diode (LED).

8. The circuit board assembly according to claim 1, wherein the edge surface of the circuit board is an exterior surface of the circuit board.

9. The circuit board assembly according to claim 1, wherein the contact portion of the second electrical contact is soldered to the first electrical contact of the light emitting element.

10. The circuit board assembly according to claim 1, wherein the contact portion of the second electrical contact is a first contact portion, the carrier comprises a slot, and the second electrical contact comprises a second contact portion and an intermediate portion that extends between and interconnects the first and second contact portions, the intermediate portion of the second electrical contact being held within the slot of the carrier, the second contact portion of the second electrical contact being engaged with and electrically connected to the electrical conductor of the circuit board.

11. A circuit board assembly comprising:
a circuit board having opposite first and second surfaces each extending between at least one edge surface that intersects the first and second surfaces; and
a light emitting element assembly comprising:
a carrier mounted on the circuit board such that at least a portion of the carrier extends along at least one of the first and second surfaces, the carrier comprising a face and an opening extending through the face; and
a light emitting element mounted along the face of the carrier such that at least a portion of the light emitting element extends along the edge surface within a thickness of the circuit board defined between the first and second surfaces, the light emitting element being electrically connected to the circuit board via an electrical contact that extends within the opening of the carrier.

12. The circuit board assembly according to claim 11, wherein the light emitting element assembly further comprises a cover covering at least a portion of the face of the carrier.

13. The circuit board assembly according to claim 11, wherein the light emitting element comprises a light emitting axis that extends within the thickness of the circuit board.

14. The circuit board assembly according to claim 11, wherein light emitting element is mounted on the carrier such that an entirety of the light emitting element extends within the thickness of the circuit board.

15. The circuit board assembly according to claim 11, wherein at least a portion of the edge surface of the circuit board extends substantially perpendicular to the first and second surfaces of the circuit board.

16. The circuit board assembly according to claim 11, wherein the edge surface of the circuit board is an exterior surface of the circuit board.

17. An electrical connector assembly comprising:
a circuit board having opposite first and second surfaces each extending between at least one edge surface that intersects the first and second surfaces;
a cage member having at least one compartment for receiving a pluggable electrical component therein, the cage member being mounted on the first surface of the circuit board; and
a light emitting element assembly comprising:
a carrier mounted on the circuit board such that at least a portion of the carrier extends along the second surface of the circuit board, the carrier comprising a body having a face and an opening extending through the face, at least a portion of the face extending along the edge surface within a thickness of the circuit board defined between the first and second surfaces; and
a light emitting element mounted along the face of the carrier, the light emitting element being electrically connected to the circuit board via an electrical contact that extends within the opening of the carrier.

18. The electrical connector assembly according to claim 17, wherein the light emitting element assembly further comprises a cover covering at least a portion of the face of the carrier.

19. The electrical connector assembly according to claim 17, wherein the light emitting element assembly further comprises a cover covering at least a portion of the face of the carrier, the cover comprising an opening aligned with a light emitting axis of the light emitting element.

20. The electrical connector assembly according to claim 17, wherein the light emitting element is mounted along the face of the carrier such that at least a portion of the light emitting element extends along the edge surface within the thickness of the circuit board defined between the first and second surfaces.

21. The electrical connector assembly according to claim 17, further comprising an electrical connector disposed within the cage member, the electrical connector configured to electrically connect to the pluggable electrical component when the pluggable electrical component is received within the compartment.

22. The electrical connector assembly according to claim 17, wherein the at least a portion of the carrier at least one of extends over at least a portion of the second surface of the circuit board or covers at least a portion of the second surface of the circuit board.

23. The electrical connector assembly according to claim 17, wherein the carrier comprises first and second legs, the first leg extending over at least a portion of the edge surface of the circuit board and comprising the face, the second leg extending over at least a portion of the second surface of the circuit board.

* * * * *